US009208990B2

(12) United States Patent
Tamaki et al.

(10) Patent No.: US 9,208,990 B2
(45) Date of Patent: Dec. 8, 2015

(54) PHASE PLATE AND ELECTRON MICROSCOPE

(75) Inventors: Hirokazu Tamaki, Tokyo (JP); Yoshio Takahashi, Tokyo (JP); Hiroto Kasai, Tokyo (JP); Hiroyuki Kobayashi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/129,261

(22) PCT Filed: May 22, 2012

(86) PCT No.: PCT/JP2012/063099
§ 371 (c)(1),
(2), (4) Date: Feb. 24, 2014

(87) PCT Pub. No.: WO2013/005490
PCT Pub. Date: Jan. 10, 2013

(65) Prior Publication Data
US 2014/0224988 A1  Aug. 14, 2014

(30) Foreign Application Priority Data
Jul. 1, 2011  (JP) ................................. 2011-147256

(51) Int. Cl.
*H01J 37/09* (2006.01)
*H01J 37/295* (2006.01)
(Continued)

(52) U.S. Cl.
CPC ............... *H01J 37/147* (2013.01); *H01J 37/09* (2013.01); *H01J 37/26* (2013.01); *H01J 37/295* (2013.01); *H01J 37/263* (2013.01); *H01J 2237/2614* (2013.01)

(58) Field of Classification Search
CPC ........... H01J 37/02; H01J 37/04; H01J 37/09; H01J 37/26; H01J 37/268; H01J 37/285; H01J 37/295; H01J 37/2955
USPC ................................................ 250/306–443.1
See application file for complete search history.

(56) References Cited

U.S. PATENT DOCUMENTS 5,814,815 A * 9/1998 Matsumoto et al. .......... 250/311
2002/0011566 A1 * 1/2002 Nagayama et al. ........... 250/311
(Continued)

FOREIGN PATENT DOCUMENTS

DE   10 2006 055 510 A1   5/2008
DE   10 2007 007 923 A1   8/2008
(Continued)

OTHER PUBLICATIONS

Cambie, R., et al., "Design of a microfabricated, two-electrode phase-contrast element suitable for electron microscopy", Ultramicroscopy 107 (2007), 329-339.
(Continued)

Primary Examiner — Jack Berman
Assistant Examiner — David E Smith
(74) Attorney, Agent, or Firm — Miles & Stockbridge P.C.

(57) ABSTRACT

Provided is a phase plate for use in an electron microscope which lessens the problem of image information loss caused by interruption of an electron beam and ameliorates the problem of anisotropic potential distributions. This phase plate comprises openings (23) connected into a single opening, and multiple electrodes (11) arranged in the opening from the outer portion of the opening towards the center of the opening. The cross sections of the electrodes (11) are configured such that a voltage application layer (24) comprising a conductor or a semiconductor is covered by a shield layer comprising a conductor or a semiconductor with an intermediate insulating layer. By this means, this phase plate is capable of lessening electron beam interruption due to the electrodes (11), and of ameliorating the problem of anisotropic potential distributions.

19 Claims, 19 Drawing Sheets

(51) Int. Cl.
*H01J 37/147* (2006.01)
*H01J 37/26* (2006.01)

(56) References Cited

U.S. PATENT DOCUMENTS

| | | | |
|---|---|---|---|
| 2008/0035854 A1* | 2/2008 | Jin et al. | 250/396 R |
| 2008/0296509 A1* | 12/2008 | Schroder et al. | 250/398 |
| 2010/0001183 A1* | 1/2010 | Zach | 250/307 |
| 2010/0038537 A1 | 2/2010 | Benner | |
| 2010/0065741 A1* | 3/2010 | Gerthsen et al. | 250/311 |

FOREIGN PATENT DOCUMENTS

| | | |
|---|---|---|
| DE | 10 2008 037 698 A1 | 2/2010 |
| JP | 60-007048 A | 1/1985 |
| JP | 09-237603 A | 9/1997 |
| JP | 2001-273866 A | 10/2001 |
| JP | 2008-198612 A | 8/2008 |
| JP | 2009-529777 | 8/2009 |
| JP | 2011-187214 A | 9/2011 |
| JP | 2011-187215 A | 9/2011 |
| JP | 2013-016305 A | 1/2013 |

OTHER PUBLICATIONS

Office Action dated Feb. 5, 2014, in German Patent Application No. 11 2012 002 612.8.
Scherzer, Von O., "Zur Theorie der Abbildung einzelner Atome in dicken Objekten," OPTIK 38, Heft 4, 1973, Seite 387-405.

* cited by examiner (a)

| CONDITION | $V_1$ | $V_2$ | $V_3$ |
|---|---|---|---|
| 1 | $V_{ref}$ | $V_{ref}$ | $V_{ref}$ |
| 2 | $V_{ref}$ | $V_{ref} + V_{adjust}$ | $V_{ref}$ |
| 3 | $V_{ref}$ | $V_{ref} - V_{adjust}$ | $V_{ref}$ |
| 4 | $V_{ref}$ | $V_{ref}$ | $V_{ref} + V_{adjust}$ |
| 5 | $V_{ref}$ | $V_{ref} + V_{adjust}$ | $V_{ref} + V_{adjust}$ |
| 6 | $V_{ref}$ | $V_{ref} - V_{adjust}$ | $V_{ref} + V_{adjust}$ |
| 7 | $V_{ref}$ | $V_{ref}$ | $V_{ref} - V_{adjust}$ |
| 8 | $V_{ref}$ | $V_{ref} + V_{adjust}$ | $V_{ref} - V_{adjust}$ |
| 9 | $V_{ref}$ | $V_{ref} - V_{adjust}$ | $V_{ref} - V_{adjust}$ |

PHASE PLATE AND ELECTRON MICROSCOPE

TECHNICAL FIELD

The present invention relates to an electron microscope, and more specifically, to a phase difference electron microscope technology using a transmission electron microscope which forms an image by an electron beam that has transmitted through the sample.

BACKGROUND ART

The transmission electron microscope (hereinafter referred to as TEM) is helpful in observation of a microstructure of an observation subject irradiated with an electron beam accelerated at a high voltage (several tens to several hundreds of kV) and allowing the electron beam transmitting through the subject to form and magnify the image by means of the electromagnetic lens. Various types of examinations and developments of the microscope have been conducted. Especially, so-called phase contrast is one of elements which constitute an image contrast of the TEM. It is obtained by using a phase difference between a scattered wave and a non-scattered wave, which is caused by aberration and defocusing of the objective lens. As for the phase contrast, various phase plates have been proposed in order to realize the high contrast observation by applying the optical path difference (see Patent literatures 1 to 4, and Non-patent literature 1).

The patent literature 1 proposes the phase plate that changes the phase of the scattered wave using the inner potential of the amorphous thin film. The patent literatures 2 and 3 propose the phase plate for controlling the phase of the non-scattered wave using an electrostatic potential generated in space by the electrode to which the voltage is applied. The patent literature 4 proposes the phase plate by applying AB (Aharonov-Bohm) effect derived from the magnetic flux confined in the magnetic body.

CITATION LIST

Patent Literature

Patent Literature 1: JP-A-2001-273866
Patent Literature 2: JP-A-09-237603
Patent Literature 3: Japanese Translation of PCT International Application Publication No. 2009-529777
Patent Literature 4: JP-A-60-7048

Non-Patent Literature

Non-Patent Literature 1: O. Scherzer: Optik 38 (1973) 387.

SUMMARY OF INVENTION

Technical Problem

FIG. 1 illustrates an image-forming process in the TEM for the purpose of explaining the problem to be solved by the present invention. As FIG. 1(a) shows, an electron beam 2 radiated to an observation sample 1 is divided into an electron beam 3 with a scattered wave that scatters under the influence of the sample, and an electron beam 4 with a non-scattered wave which has transmitted through the sample under no influence thereof. Those electron beams form an image on an image surface 9 via an objective lens 5 and a back focal plane 6. FIG. 1(b) represents a so-called diffraction pattern illustrating the back focal plane 6 as the surface perpendicular to an optical axis 10. In the back focal plane, the non-scattered wave 4 is converged into one point on the optical axis to form a non-scattered wave spot 8 as a point source image. Likewise, the scattered wave 3 which scatters at an equal angle is converged into one point in the back focal plane 6 defined by a scattered angle so as to form a scattered wave spot 7 as the point source image. As described above, the scattered wave and the non-scattered wave separately exist in the back focal plane.

A phase contrast is one of elements which constitute the image contrast of the TEM. It is obtained by using the phase difference between the scattered wave and the non-scattered wave, which is caused by the aberration and defocusing of the objective lens. The phase difference between the scattered and the non-scattered waves will be described hereinafter.

Assuming that the wavelength of the electron beam is designated as $\lambda$, and the size of the sample structure is designated as d, the scattered angle designated as $\alpha$ shown in FIG. 1(a) may be expressed by the following equation.

$$\alpha = \frac{\lambda}{d} \quad \text{[Equation 1]}$$

In the case where the accelerating voltage is set to 100 kV (waveform $\lambda$=3.7 μm), and the size d is set to approximately 10 nm, the value of $\alpha$ becomes approximately $10^{-4}$ rad. If the focal length f of the objective lens is equal to 3 mm, a distance r between the scattered wave spot 7 and the non-scattered wave spot 8 in the back focal plane 6 will be expressed by the following equation, and the value becomes 1 μm approximately.

$$r = f\alpha = f\lambda \cdot \frac{1}{d} \quad \text{[Equation 2]}$$

If the objection lens has the aberration and defocusing, the electron beam incident on the lens passes the different optical path in accordance with the incident angle, thus causing the optical path difference between the scattered wave and the non-scattered wave. Assuming that the optical path difference is designated as $\chi(\alpha)$, the following equation is established. The term Cs denotes the spherical aberration factor of the objective lens, and f denotes the defocusing amount (positive at the under focus side) (see Non-patent literature 1).

$$\chi(\alpha) = \frac{1}{4}C_s\alpha^4 - \frac{1}{2}\Delta f \alpha^2 \quad \text{[Equation 3]}$$

The phase contrast forms the image through the phase contrast transfer function PCTF($\alpha$) expressed by the following equation using the optical path difference $\chi(\alpha)$. The observation image is derived from modulation through the phase contrast transfer function.

$$PCTF(\alpha) = \sin\left(-\frac{2\pi}{\lambda}\chi(\alpha)\right) \quad \text{[Equation 4]}$$

In the region at the small angle $\alpha$, the value of the optical path difference $\chi(\alpha)$ becomes small, and accordingly, the phase contrast transfer function has a small value. In this way, the larger the structure size d of the sample becomes, the smaller the value α is made, thus suppressing transfer of the information transfer. That is, it is difficult for the larger structure to obtain the contrast.

Especially, the sample such as the biological tissue and the polymeric material applies to the aforementioned case. In most cases, the sample is composed of a light element having weak interaction with the electron beam, and has the size of several nms or larger. It is therefore difficult to realize the high contrast observation. The sample staining technique using the heavy element has been often applied. However, the staining technique has a problem of causing the sample transformation resulting from the staining by itself. The method for observing the sample as it is (in-vivo) has been demanded.

Various approaches for arrangement of an optical element so-called phase plate in the back focal plane of the objective lens or the adjacent area have been developed for the purpose of controlling the optical path difference as described above. Use of the phase plate allows application of the optical path difference even to the scattered wave at the small diffraction angle α. This makes it possible to realize high contrast observation.

The generally employed phase plate, however, has both advantage and disadvantage as described below. The patent literature 1 discloses that the amorphous thin film having an opening with approximately 1 μm diameter is disposed in the back focal plane, and the thin film thickness is adjusted to allow control of the optical path difference between the non-scattered wave and the scattered wave. This makes it possible to improve the image contrast. Radiated electron beams may be highly accelerated in order to mitigate the large attenuation resulting from passage of the scattered wave through the thin film. The scattered angle is decreased in inverse proportion to the accelerated voltage, which may cause an extraneous problem of difficulty in the phase plate design.

The patent literature 2 proposes the phase plate using the annular electrode as shown in FIG. 2. The annular electrode is configured to have its surface covered by the conductor except the inner surface opposite the optical axis via an insulator. In the case where the annular electrode is used, the electron beams which scatter at the angle in the range defined by the inner diameter $r_{in}$ and the outer diameter $r_{out}$ of the electrode are completely interrupted by the annular electrode. The information about the sample structure from the observation image is partially lost in all directions.

For that reason, the patent literature 3 discloses that the electrode for controlling the phase is formed into a single rod-like structure rather than the annular structure, which extends to reach around the non-scattered wave spot 8 (area A of FIG. 3) as shown in FIG. 3. The phase plate generates the potential from the leading end of the single electrode extending to reach the area around the non-scattered wave spot 8, resulting in the phase difference between the scattered wave and the non-scattered wave. However, the distance between the leading end of the electrode and the scattered wave spot B1 is different from the distance between the leading end and the scattered wave spot B2, thus causing difference in the phase change amount. As the potential distributions generated by the phase plate are anisotropic with respect to the non-scattered wave spot 8, the obtained image is distorted, leading to deterioration in the spatial resolution and the image quality.

The patent literature 4 discloses the phase plate using magnetic properties. The phase difference is applied by using the difference in the vector potential between inside and outside of the annular magnetic body that confines the magnetic flux therein. An advantage of this type of the phase plate is that the insulator is not used. However, there still exists the problem of interrupting the scattered wave by the annular magnetic body as well as difficulty in control of the phase change amount.

In view of the aforementioned problems, it is an object of the present invention to provide a phase plate for an electron microscope, which lessens the problem of image information loss caused by interruption of an electron beam, and ameliorates the problem of anisotropic potential distributions.

It is another object of the present invention to provide an electron microscope with the aforementioned phase plate.

Means for Solving the Problem

In order to achieve the object, the present invention provides a phase plate used for an electron microscope which includes openings connected into a single opening, and multiple electrodes arranged in the opening from an outer portion of the opening towards the center of the opening. The multiple electrodes are configured to have voltage application layers each composed of a conductor or a semiconductor covered by shield layers each composed of the conductor or the semiconductor via insulators.

In order to achieve the object, the present invention provides a phase plate used for an electron microscope, which includes an opening, and multiple electrodes arranged in the opening from an outer portion of the opening to the center of the opening. The multiple electrodes have voltage application layers each composed of a conductor or a semiconductor covered by shield layers each composed of the conductor or the semiconductor via insulators. The voltage application layers of the multiple electrodes are electrically independent from one another.

In order to achieve the object, the present invention provides an electron microscope for observing a sample using an electron beam, which includes a light source of the electron beam, an irradiation optical system for irradiating the sample with the electron beam emitted from the light source, a lens system for forming an image of the sample, a phase plate which applies a phase difference to the electron beam from the sample, a control unit for controlling the electron microscope, and a display device connected to the control unit for displaying an observation image of the sample. The phase plate includes openings connected into a single opening, and multiple electrodes arranged in the opening from an outer portion to the center of the opening. The multiple electrodes have voltage application layers each composed of a conductor or a semiconductor covered by shield layers each composed of the conductor or the semiconductor via insulators.

Advantageous Effect of Invention

The present invention provides the phase plate which is capable of lessening interruption of the electron beam and ameliorating the problem of anisotropic potential distributions. The present invention further provides the electron microscope with the aforementioned phase plate, and the phase plate control method using the electron microscope.

BRIEF DESCRIPTION OF DRAWINGS

FIG. 18 is a table representing conditions of combining voltages applied to the respective electrodes according to the eighth embodiment.

DESCRIPTION OF EMBODIMENT

Figure 1:
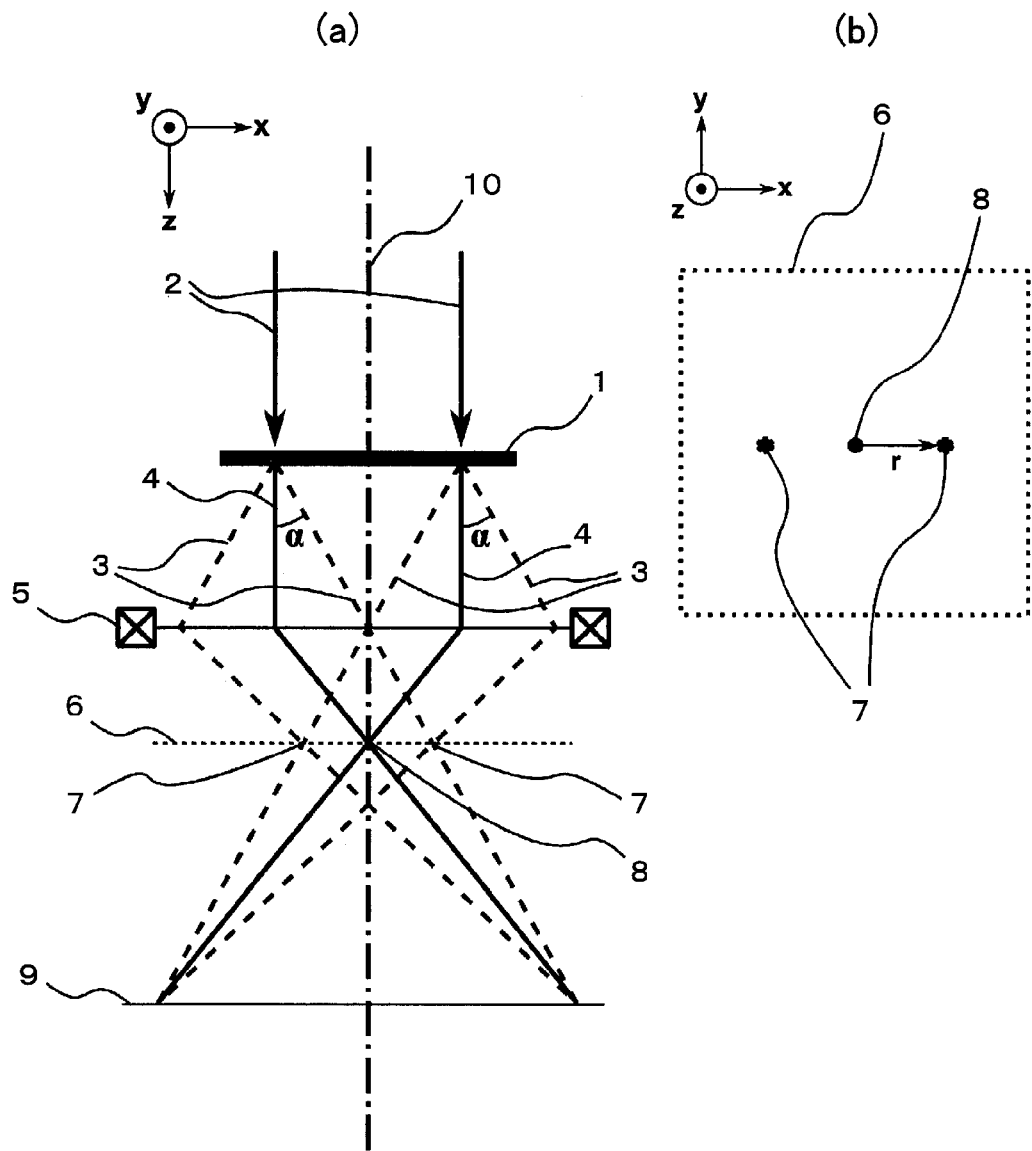
FIGS. 1(a)-1(b) are schematic views illustrating an image-forming process in a TEM.
Figure 2:
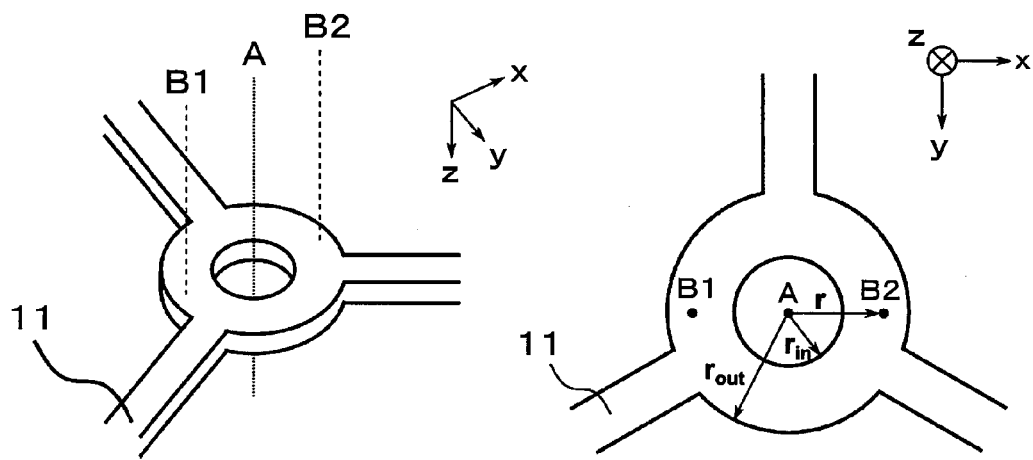
FIG. 2 is a schematic view illustrating an electrode part of a generally employed phase plate with an annular electrode.

Respective examples of the present invention will be described referring to the drawings.

First Embodiment

A first embodiment shows the phase plate configured to lessen the problem of image information loss caused by interruption of an electron beam, and to ameliorate the problem of anisotropic potential distributions. As the phase plate is arranged around the back focal plane of the objective lens for use, it is configured to be interchangeable with an objective diaphragm plate of the electron microscope. It is attached to the objective movable aperture holder so as to be easily incorporated with the TEM.

Figure 5:
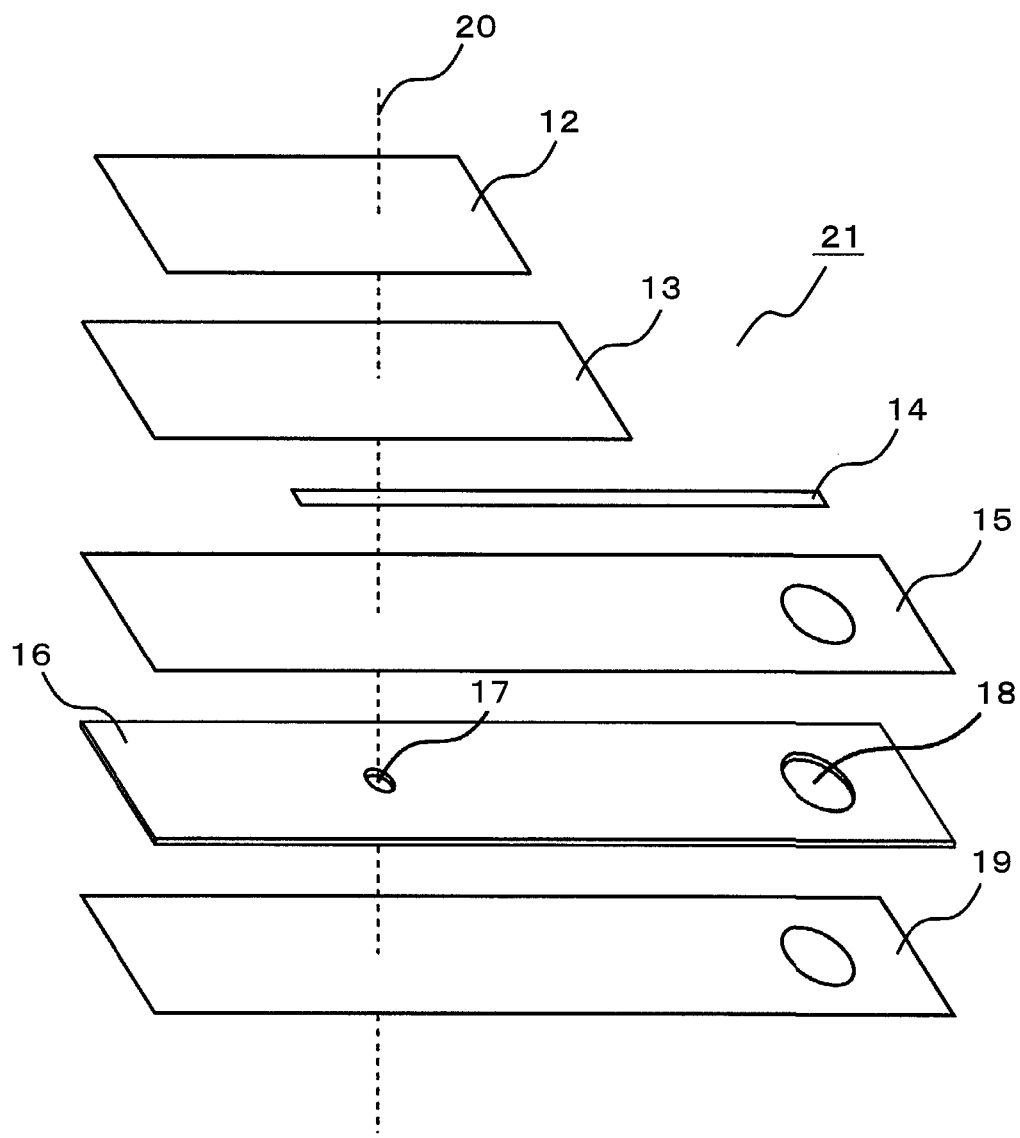
FIG. 5 is a schematic view illustrating respective layers which constitute the phase plate according to the first embodiment.

FIG. 5 schematically illustrates the respective layers that constitute a phase plate 21 according to the embodiment. The phase plate is configured to have multilayer films 12 to 15, and 19 on the objective diaphragm plate 16. A voltage application layer 14 for applying the voltage is interposed between insulating layers 13 and 15, the respective surfaces of which are covered by shield layers 12 and 19. The objective diaphragm plate 16 has an opening-forming hole 17 for the phase plate so as to form the opening and electrode of the phase plate at the opening-forming position as indicated by a dashed line 20. The finished phase plate is fixed to the objective aperture holder via a fixing hole 18 for use. Such material as Au, Al, Ti, Cu, Pt, Pd, Si and Ge may be used for forming the voltage application layer 14, and shield layers 12 and 19. The material for forming the insulating layers 13 and 15 may be typically $SiO_2$, but any other material such as SiN and $Al_2O_3$ are available with no problem. The film may be formed by using an electron-beam heating type vacuum deposition system, CVD (Chemical Vapor Deposition) and spatter as well as a resistance heating type vacuum deposition system. It is possible to process the rod-like electrode in the opening and the outer portion of the opening through lithography and etching as well as the focused ion beam.

Figure 6A:
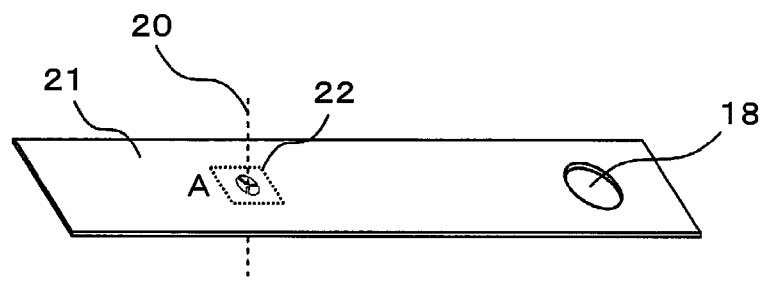
FIGS. 6A(a)-6A(d) are views illustrating an example of the phase plate according to the first embodiment.
Figure 6A:
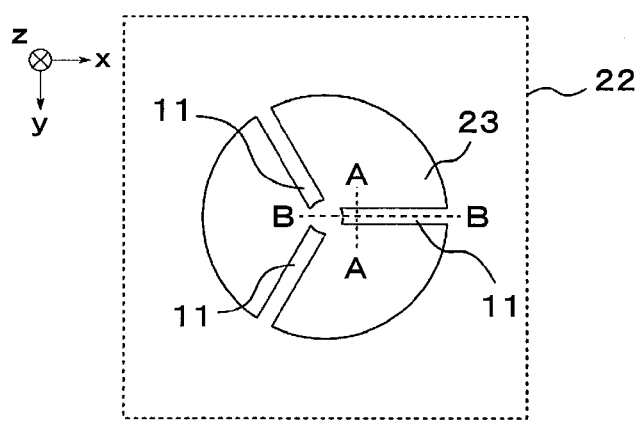
Figure 6A:
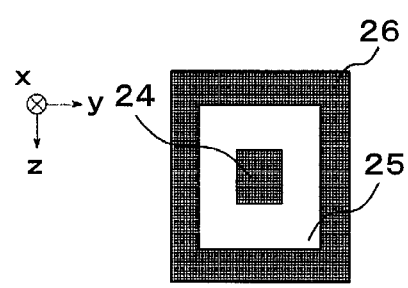
Figure 6A:
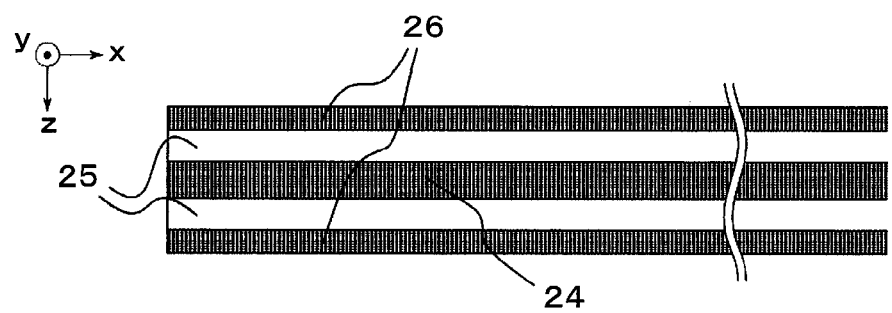
Figure 6B:
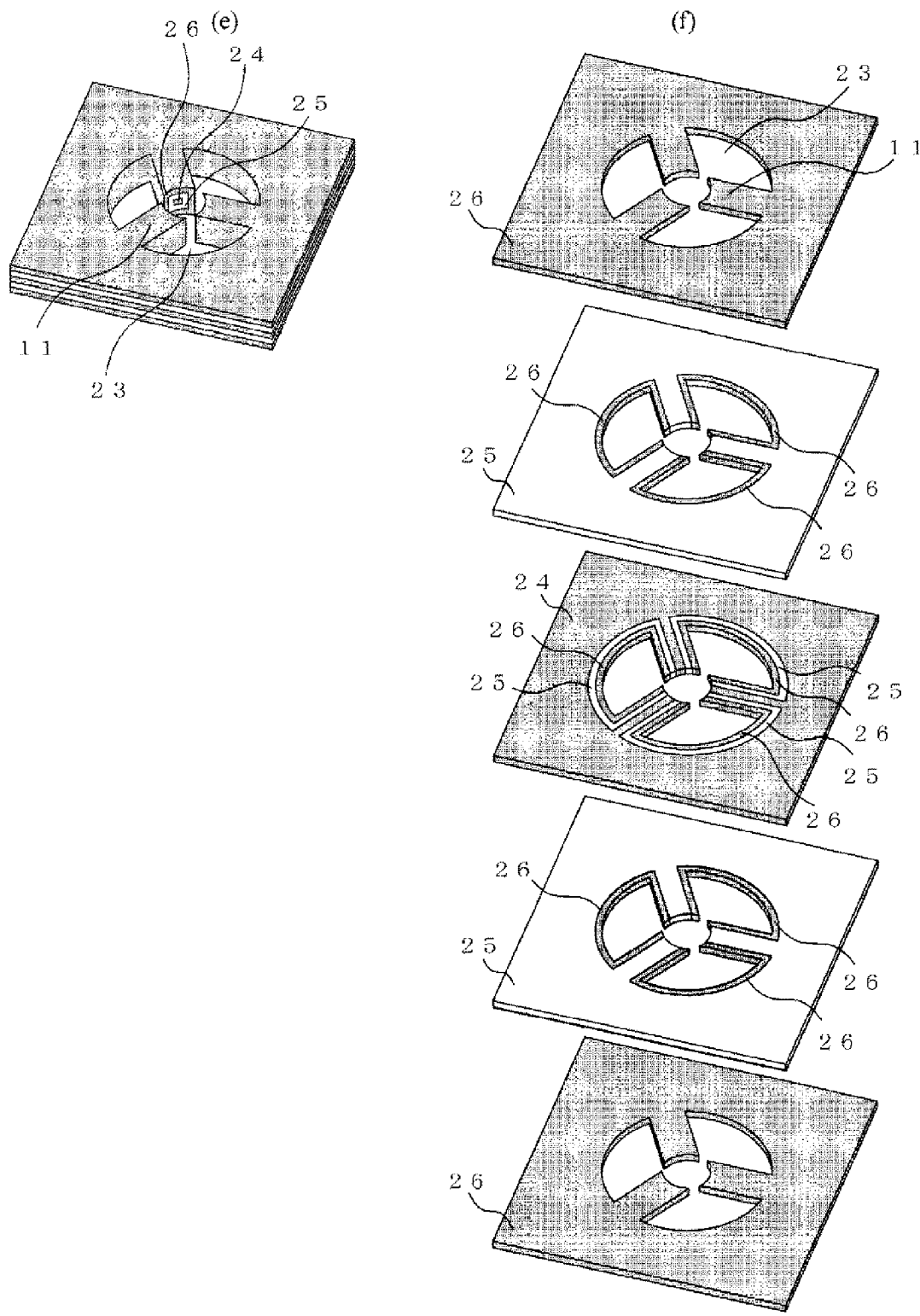
FIGS. 6B(e)-6B(f) are views illustrating an example of the phase plate according to the first embodiment.

FIGS. 6A and 6B illustrate an example of the phase plate according to the embodiment. FIG. 6A(a) is an overview of the phase plate. FIG. 6A(b) is an enlarged view of an area 22 enclosed by a dashed line shown in FIG. 6A(a). FIG. 6A(c) shows a cross section structure of the part taken along dashed line A-A of FIG. 6A(b). FIG. 6A(d) shows a cross section structure of the part taken along dashed line B-B of FIG. 6A(b). FIG. 6B(e) is a perspective view of the same area 22 as shown in FIG. 6A(b). FIG. 6B(f) is a perspective view illustrating the structure of the respective layers that constitute the area shown in FIG. 6B(e).

FIG. 6A(a) is an overview diagram of the phase plate 21 formed on the objective diaphragm plate by following the aforementioned procedure. A circular opening 23 with about 50 μm diameter connected into a single opening is formed as shown in FIG. 6A(b). The phase plate includes multiple rod-like electrodes 11 which extend from the outer portion of the opening 23 towards the center, while keeping the opening 23 connected into the single opening.

As FIG. 6A(c) represents, the voltage application layer 24 composed of the conductor or the semiconductor exists inside the electrode 11, and is surrounded by an insulating layer 25 for electric isolation. The surface is further covered by a shield layer 26 composed of the conductor or the semiconductor. The voltage is applied to the voltage application layer 24, and the shield layer 26 is electrically grounded.

As FIGS. 6B(e) and 6B(f) show, the phase plate has a five-layered structure formed by laminating the shield layer 26, the insulating layer 25, the voltage application layer 24, the insulating layer 25 and the shield layer 26 in this order. The voltage application layer 24 is covered by the shield layer 26 so that only the part at the leading end of the electrode is exposed. Accordingly, upon application of the voltage, the potential is generated from the leading end of the electrode towards the periphery.

Referring to the structure of the phase plate according to the embodiment, two major advantages may be obtained by the structure that allows the multiple electrodes 11 to surround the center of the opening 23.

The first advantage is lessening of the problem concerning the phase plate with respect to interruption of the electron beam as disclosed in the patent literature 2. The subject structure has no annular electrode, and the opening 23 is connected into the single opening. This makes it possible to avoid the problem that all the information about the sample structure with respect to the specific size is lost.

Figure 4:
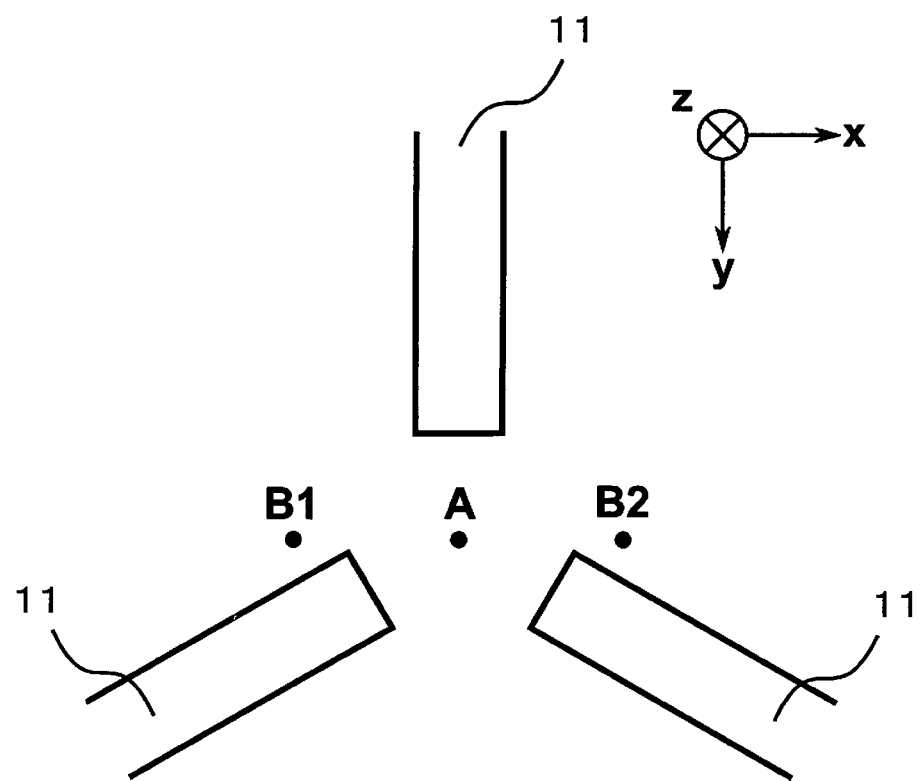
FIG. 4 is a view schematically illustrating a phase plate according to a first embodiment, which is configured that a non-scattered wave is surrounded by multiple separated electrodes.

Preferably, the electrodes are arranged so as not to be symmetrical with respect to the non-scattered wave spot 8. The electron beams in the back focal plane have complex conjugate distributions around the non-scattered wave spot 8 as the center. The conjugate electron beams having the same information about the sample structure, which pass the position symmetrical with respect to the non-scattered wave are complementarily correlated. If the complex conjugate scattered wave is interrupted by the symmetrically arranged electrodes, the corresponding information will be completely lost from the obtained image. It is therefore adequate to provide the odd numbers of electrodes in a rotational symmetric arrangement for the purpose of avoiding such information loss and obtaining the symmetrical potential distributions. FIG. 4 graphically shows the example as described above that three electrodes are arranged in a three-hold symmetry.

The second advantage is lessening of the problem of distorted observation image by allowing the potential generated by the phase plate to have anisotropic distributions with respect to the non-scattered wave spot. For this, the embodiment provides the structure that the multiple electrodes surround the center of the opening through which the non-scattered wave passes so as to generate the isotropic potential with respect to the non-scattered wave spot, and allow application of the phase modulation at the same level to the conjugate scattered wave. This makes it possible to suppress the image distortion.

Electrification and stain of the electrode of the phase plate, which are caused by continued radiation of electron beams to the electrode may be the cause of anisotropic potential distributions. Electrification occurs markedly especially at the area where the insulator is exposed, which generates unwanted potential at the peripheral area. The stain adhesion may give an adverse effect, for example, reduced insulation resistance of the phase plate electrode, and interference in the potential formation by the electrode. The disadvantages result in the anisotropic potential distributions generated by the phase plate, and the distorted image, leading to the problem of fluctuation in the applied phase shift amount.

Figure 3:
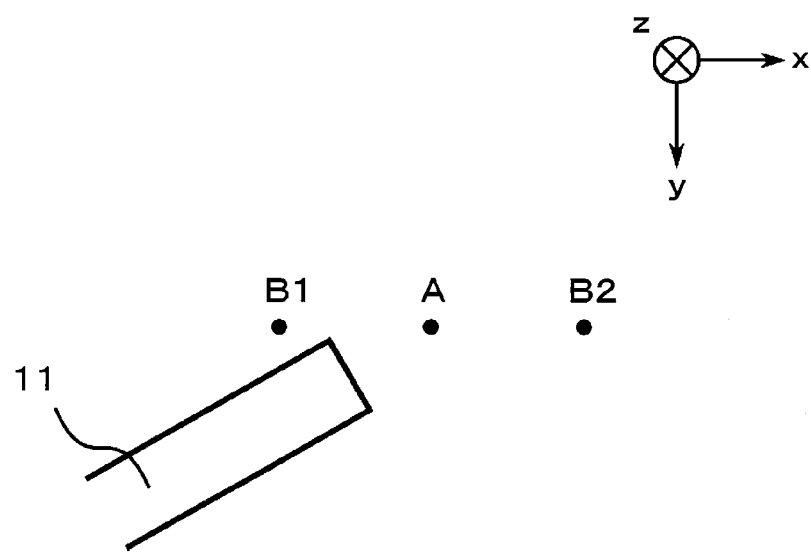
FIG. 3 is a schematic view illustrating an electrode part of a generally employed phase plate with a single rod-like electrode.

For the aforementioned problem, the phase plate is configured to have separate electrodes without using the annular electrode as shown in FIG. 3 so as to lessen the electrification problem by reducing the exposed area of the insulator. Furthermore, the voltage application layers are made electrically independent by the respective electrodes for correction of the anisotropic potential distributions by individual control of magnitude of the voltage applied to the respective electrodes. The above-structured phase plate will be described in detail in the second embodiment below.

Second Embodiment

Figure 7:
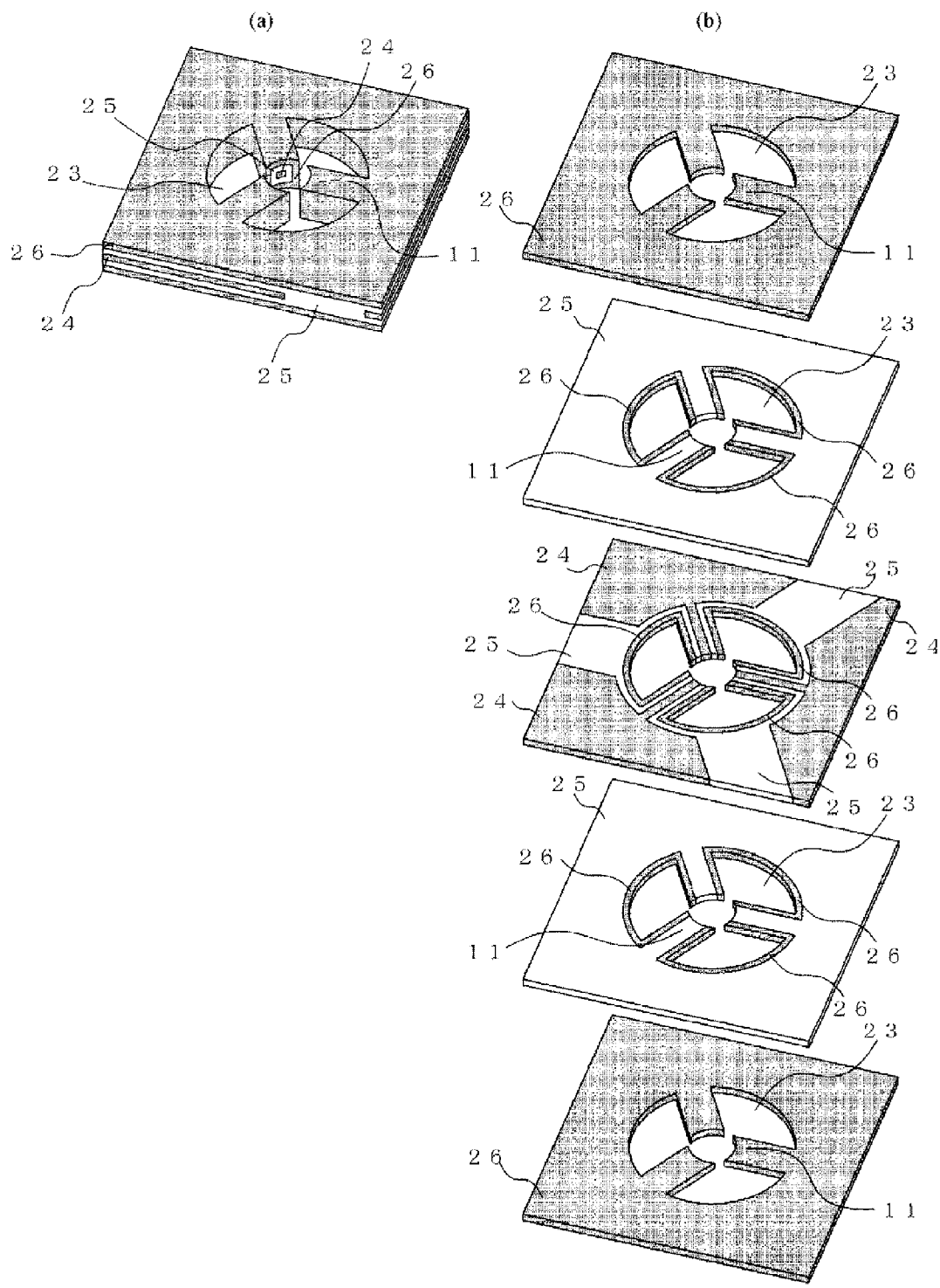
FIGS. 7(a)-7(b) are schematic views illustrating a phase plate according to a second embodiment, which is configured that a voltage application layer inside the electrode is electrically independent by each electrode.

A second embodiment relates to a structure of the phase plate configured to have the electrically independent voltage application layer inside the electrode. FIG. 7 illustrates the peripheral area 22 of the electrode of the phase plate according to the second embodiment, in which the voltage application layer 24 inside the electrode is electrically independent. FIG. 7(a) is a perspective view, and FIG. 7(b) is a schematic view illustrating the structure of the respective layers that constitute the area shown in FIG. 7(a).

Referring to the drawing, likewise the first embodiment, the phase plate includes multiple electrodes 11 which extend from the outer portion of the opening 23 with approximately 50 μm diameter towards the center of the opening. In this embodiment, the opening 23 is kept connected into the single opening. The phase plate has the voltage application layer 24 at the center of the electrode 11, and the insulating layer 25 surrounds the voltage application layer 24 for electrical isolation. Furthermore, the surface is covered by the shied layer 26 composed of the conductor or the semiconductor. The shield layer 26 is electrically grounded, and the voltage is applied to the voltage application layer 24. The electrode extending towards the center of the opening has its leading end exposed in cross section structure. Likewise the first embodiment, the potential is generated from the voltage application layer exposed to the leading end of the electrode towards the center of the opening.

This embodiment is different from the first embodiment in that the voltage application layer 24 formed inside the electrode 11 is electrically isolated by the insulating layer 25 so that the voltage to be applied to the electrode is individually adjustable. This makes it possible to correct the anisotropic potential distributions generated in the opening.

Such material as Au, Al, Ti, Cu, Pt, Pd, Si and Ge may be used for forming the voltage application layer 24 and the shield layer 26. The material for forming the insulating layer 25 may be typically $SiO_2$, but any other material such as SiN and $Al_2O_3$ are available with no problem. The film may be formed by using an electron-beam heating type vacuum deposition system, CVD and spatter as well as the resistance heating type vacuum deposition system. Lithography and etching are available as the means of processing the opening and the rod-like electrode to be formed in the outer portion of the opening as well as the focused ion beam.

Figure 8A:
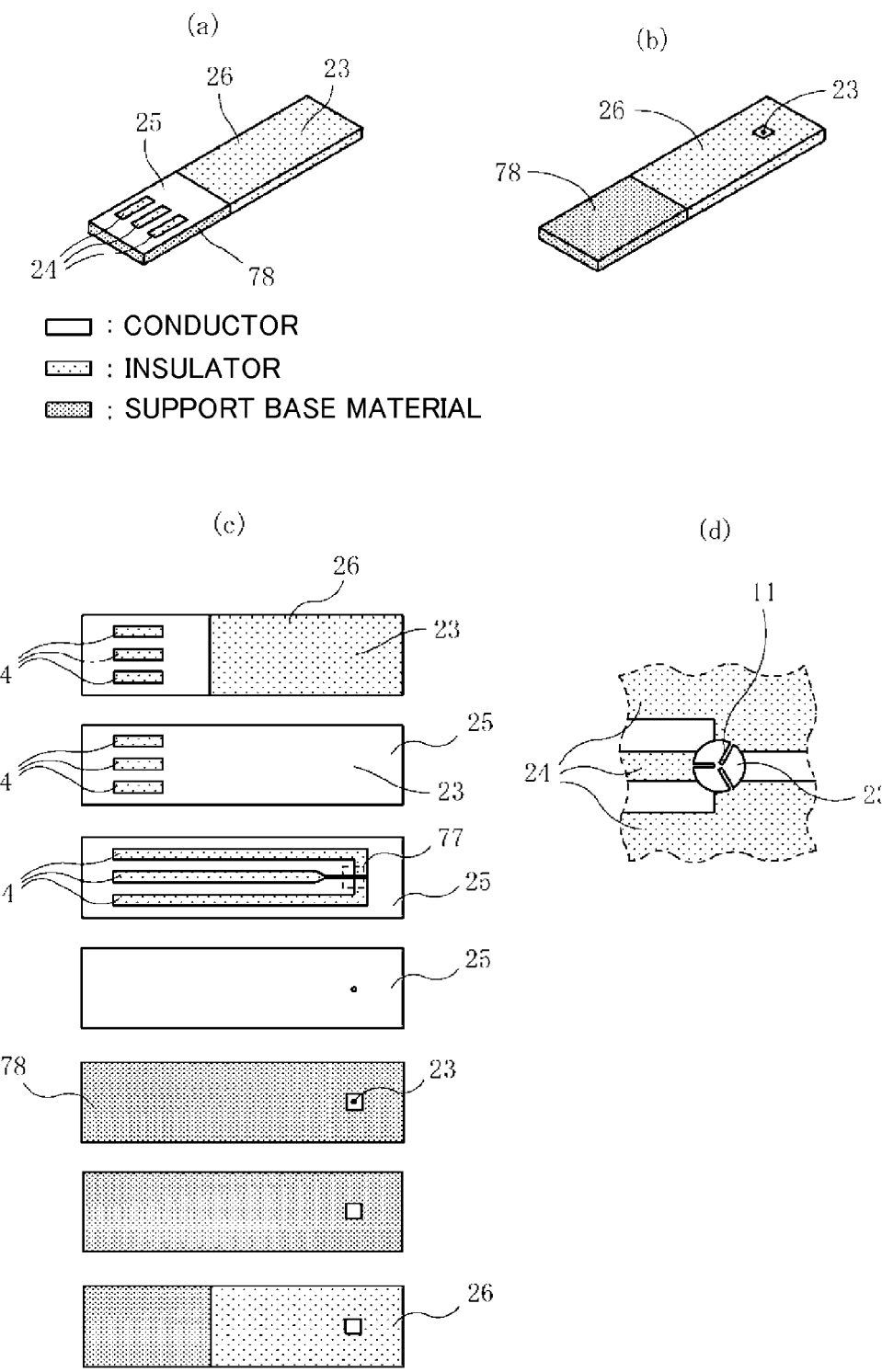
FIGS. 8A(a)-8A(d) are explanatory views of the phase plate structure according to the second embodiment, which is configured that the voltage application layers inside the electrode are electrically independent.
Figure 8B:
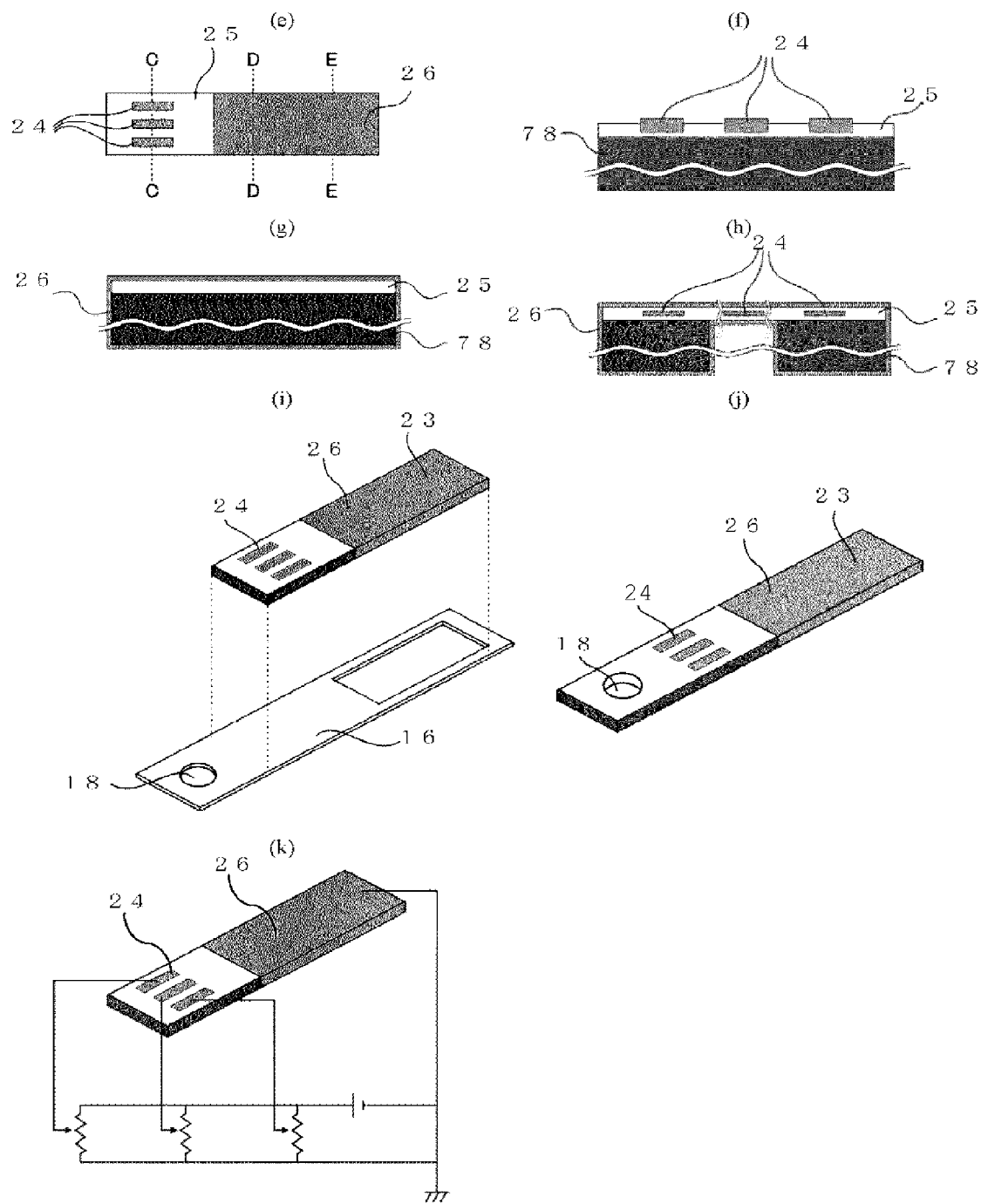
FIGS. 8B(e)-8B(k) are explanatory views of the phase plate structure according to the second embodiment, which is configured that the voltage application layers inside the electrode are electrically independent.

FIGS. 8A and 8B illustrate an example of the phase plate according to the second embodiment, which has the voltage application layers inside the electrodes electrically independent. FIG. 8A(a) is a perspective view of the phase plate seen from the upper surface. The insulating layer 25 composed of the insulator is formed on a support base material 78, on which the voltage application layers 24 composed of the conductor are formed for applying the voltage to the electrically independent electrode. The opening 23 serves to form the electrode of the phase plate, and the peripheral area is covered by the shield layer 26. Such material as Au, Al, Ti, Cu, Pt, Pd and the like may be used for forming the conductor. The material for forming the insulator may be $SiO_2$, SiN and $Al_2O_3$. Such material as Mo, W, Cu, Ti, Fe, Al and $SiO_2$ may be used for forming the support base material as well as Si and Ge.

FIG. 8A(b) is a perspective view of the phase plate seen from the back surface. The support base material 78 is partially covered by the shield layer 26, and the portion around the opening 23 has the thickness smaller than the peripheral area. FIG. 8A(c) represents the respective layers that constitute the phase plate from the upper to the lower surfaces. The uppermost portion corresponds to the upper surface layer, and the lowermost portion corresponds to the back surface layer, respectively. FIG. 8A(d) is an enlarged view of an area 77 around the electrodes enclosed by the dashed line as shown in FIG. 8A(c). The respective voltage application layers 24 are closely located in the opening 23, and connected to the respective electrodes. As FIG. 8A(d) shows, the opening 23 is kept connected into the single opening via the optical axis of the electron beam.

FIG. 8B(e) is a view of the phase plate seen from the upper surface. FIGS. 8B(f), (g) and (h) show cross section structures taken along dashed lines C-C, D-D and E-E of the drawing. FIG. 8B(i) is a view of the phase plate fixed to the objective diaphragm plate. In this way, the phase plate is interchangeable with the objective diaphragm plate, and may be attached to the objective aperture holder for use. FIG. 8B(j) illustrates a phase plate element having the fixing hole 18. This structure makes it possible to allow the phase plate to be interchangeable with the objective diaphragm plate. FIG. 8B(k) illustrates an exemplary structure for applying the voltage separately to the respective electrodes of the phase plate. The shield layer 26 is made ground potential so that the power source at dc potential to the ground potential applies multiple different potentials derived from dividing the voltage via the variable resistance to the respective voltage application layers. The aforementioned structure makes it possible to allow the single power source to generate multiple potentials to be applied.

Third Embodiment

Figure 9:
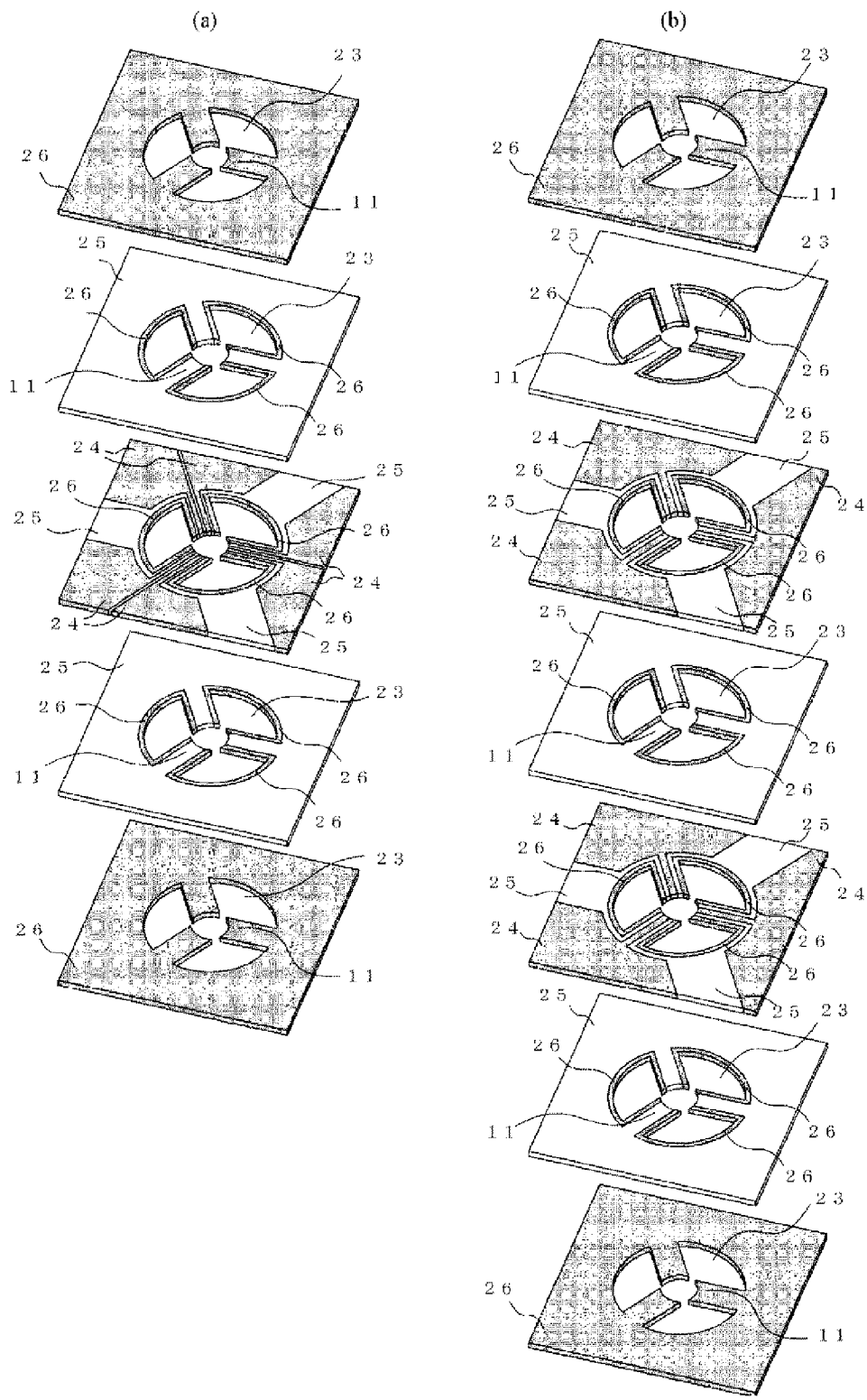
FIGS. 9(a)-9(b) are perspective views according to a third embodiment illustrating respective layers that constitute the phase plate having multiple voltage application layers inside the electrode.

A third embodiment relates to a structure of the phase plate having multiple voltage application layers inside the electrode. The phase plate shown in FIG. 9 has substantially the same structure as that of the second embodiment. FIG. 9 is a perspective view showing the structure of the respective layers that constitute the phase plate having the voltage application layers 24 separately formed inside the electrode 11 covered by the shield layer 26. FIG. 9(a) represents an example that the voltage application layer 24 is divided into two sections inside the single electrode 11. As another example, FIG. 9(b) represents the structure having multiple voltage application layers 24 laminated inside the single electrode 11, which makes it possible to realize the embodiment.

The voltage is applied to any of the voltage application layers 24, and the rest of the voltage application layers 24 are made ground potential, thus making it possible to use the phase plate in the similar way to the one described in the second embodiment. Additionally, different voltages are applied to the respective voltage application layers 24, making it possible to conduct finer control of the generated potential. Even if the insulation between any one of the voltage application layers 24 and the shield layer 26 is lost, the other voltage application layer 24 may be used as the substitute so as to allow continued use of the phase plate, leading to the long life.

Fourth Embodiment

Figure 10:
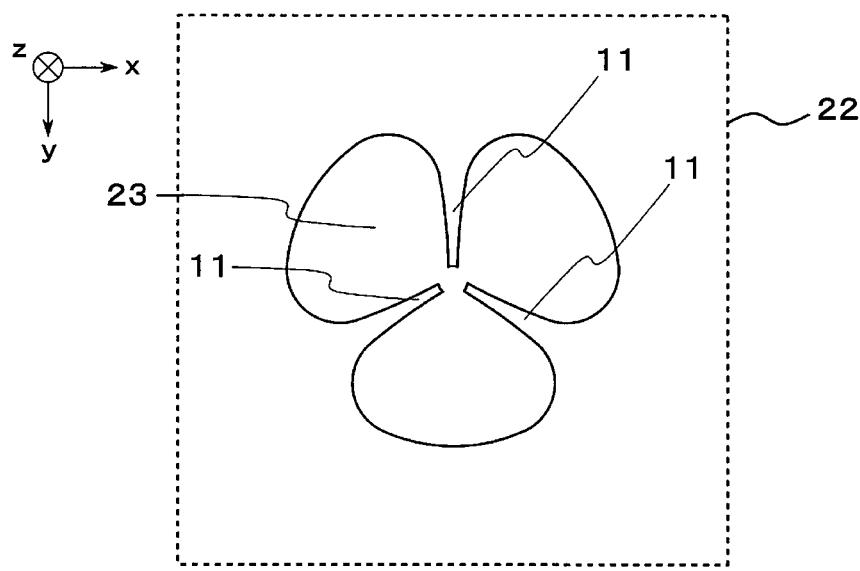
FIGS. 10(a)-10(b) are plan views representing a modified structure with respect to the electrode shape of the phase plate according to a fourth embodiment.
Figure 10:
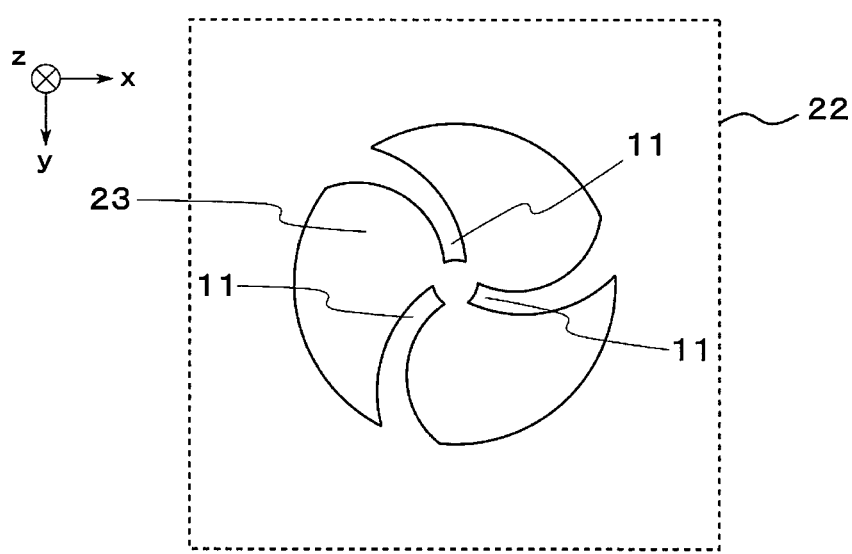

A fourth embodiment describes a modified configuration of the phase plate as described in the first to the third embodiments. FIG. 10 illustrates a typical example of the modified embodiment. Specifically, the electrode 11 needs not have a uniform thickness. As FIG. 10(a) shows, the thickness of the electrode at the outer portion of the opening may be large and decreased towards the center of the opening. It is essential that the electrodes 11 of the phase plate are arranged at the position symmetrical to the center of the opening in the back focal plane perpendicular to the optical axis. The structure shown in FIG. 10(a) improves the mechanical strength of the electrode 11, resulting in the effect of preventing vertical or horizontal shifting of the respective electrodes 11 from the back focal plane. FIG. 10(b) shows a different example. As the drawing shows, the electrode 11 does not have to be linearly configured, but may be formed to have a curved portion extending towards the center of the opening.

Fifth Embodiment

Figure 11:
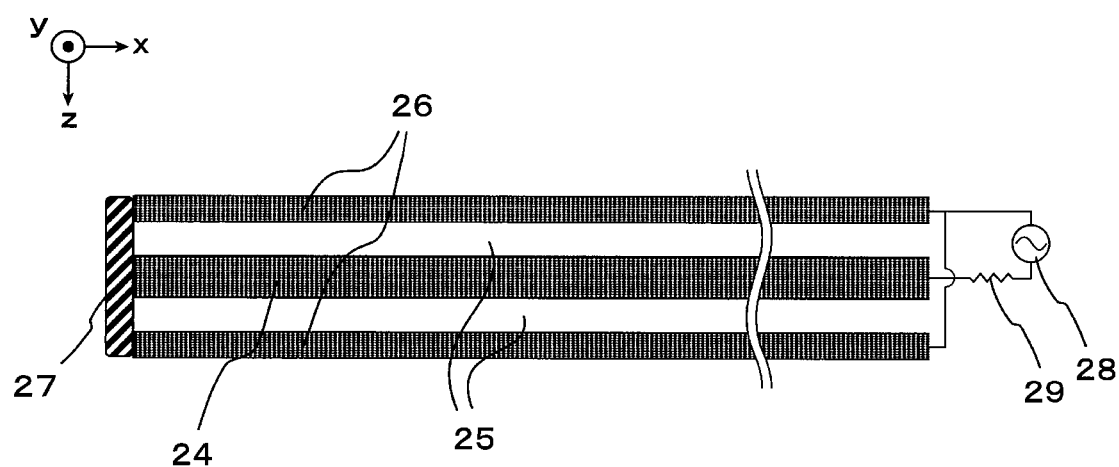
FIG. 11 is a view representing an example of a structure for measuring an impedance of the electrode of the phase plate according to a fifth embodiment.

A fifth embodiment describes an exemplary structure for measurement of electrical properties of the phase plate. The electrode of the phase plate is configured to interpose the insulating layers 25 between the voltage application layer 24 and the shield layers 26, and accordingly, the impedance exists therebetween. The impedance value may be measured by connecting a reference resistor 29 and a power source 28 to the phase plate as shown in FIG. 11. The impedance value varies depending on adhesion of a substance 27 to the leading end of the electrode. Each impedance value of the electrodes 11 of the phase plate is measured to ensure clarification of the condition of each leading end of the electrodes. In this case, the power source 28 connected to the phase plate may be any of the dc power source and the ac power source. As one of applications of the embodiment, the method of removing the adhered substance to the electrode is available through electric discharge from the leading end of the electrode and heat generation by applying the voltage to the electrode.

Sixth Embodiment

Figure 12:
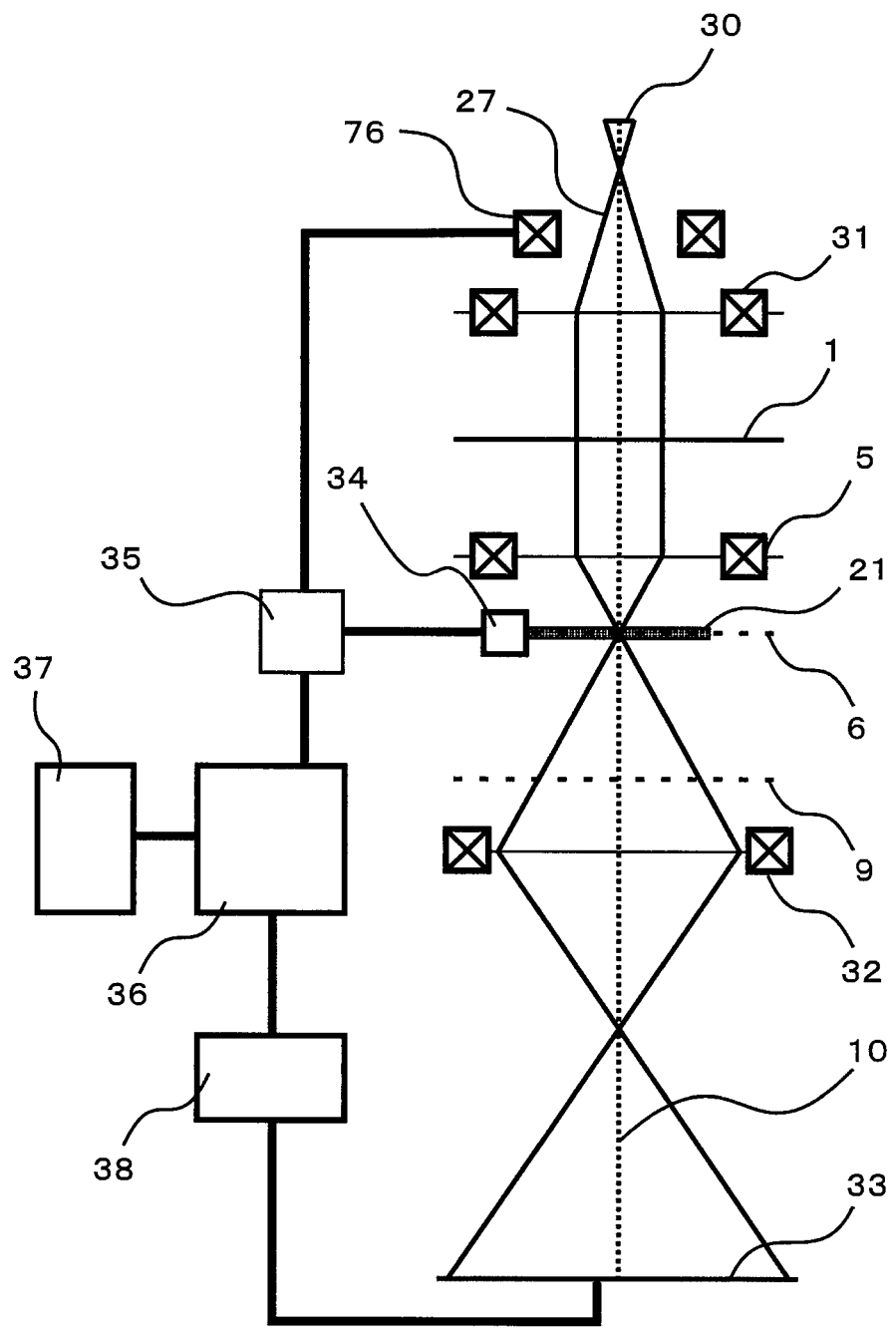
FIG. 12 is a view illustrating the TEM with the phase plate according to a sixth embodiment, and a system structure for controlling the phase plate and the TEM.

A sixth embodiment describes an exemplary system configuration for applying various types of phase plates as described above to the electron microscope. FIG. 12 illustrates a system configuration with the function for mounting the phase plate described in the first to the fourth embodiments on the TEM and adjusting the potential distributions at the center of the opening.

Referring to FIG. 12, an electron beam 27 is emitted from an electron source 30 so that an observation sample 1 is irradiated via an irradiation system lens 31. The electron beam that has transmitted through the observation sample 1 serves to form an image on a fluorescent screen 33 via an objective lens 5 and a magnifying lens 32. The phase plate 21 is attached to an objective diaphragm micro moving mechanism 34 for micro movement of the phase plate 21, and disposed in the back focal plane 6 of the objective lens 5. The voltage applied to the phase plate 21 is controlled by a computer 36 via a control unit 35. The control unit 35 controls overall operation of the electron microscope as well as the electronic optical system such as the irradiation system lens 31 and the magnifying lens 32. The control unit 35 and the computer 36 may be generally referred to as a controller all through the description.

An operator operates an input device 37 and uses the computer 36 while referring the control screen as GUI (Graphical User Interface) displayed on a display device 38 as a display unit. The computer 36 as a generally employed computer unit includes a CPU (Central Processing Unit), a memory as a storage unit for storing various programs and data which are executed by the CPU, and an input/output interface unit connected to the input device 37 and the display device 38.

Figure 13:
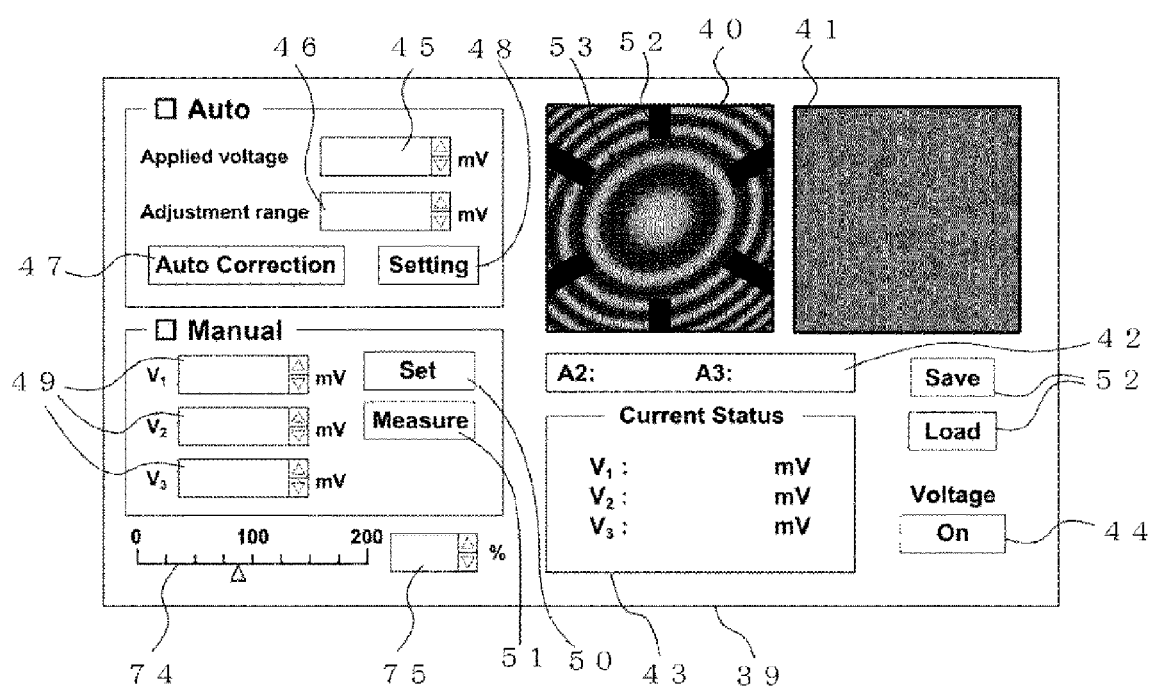
FIG. 13 represents an example of a control screen for controlling the phase plate according to the sixth embodiment.

FIG. 13 shows an example of the control screen displayed on the display device 38 shown in FIG. 12. The control screen 39 displays an actual space image 41 derived from the TEM, and a pattern 40 called diffractgram obtained by applying Fourier transformation to the actual space image 41, which is performed by the processor of the controller, for example, CPU. The diffractgram indicates the frequency information contained in the actual space image 41. The part with missing information owing to interruption of the electron beam by the phase plate electrode is displayed as a shade 52 of the electrode. Light and shade rings 53 which appear in the diffractgram are caused by the phase difference between the scattered wave and the non-scattered wave. The ring 53 will be displayed as a true circle if the scattered wave has an isotropic phase change with respect to the non-scattered wave, and will be displayed deformed if the scattered wave has the anisotropic phase change. Accordingly, it is possible to determine with respect to anisotropy of the phase change caused by the phase plate as described in the aforementioned embodiments by measuring the distortion amount of the light and shade ring 53.

A reference numeral 42 denotes an area for displaying the information about the image distortion amount, reference numeral 43 denotes an area indicating the voltage applied to the respective electrodes, reference numeral 44 denotes a button for selecting an operation of voltage application (ON/OFF) to the phase plate, reference numeral 45 denotes an entry field of a reference value of the voltage applied to the electrode, reference numeral 46 denotes an entry field of an adjustment range for adjusting the applied voltage, reference numeral 47 denotes a button for executing the automatic adjustment of the applied voltage, reference numeral 48 denotes a button for detail setting of the automatic adjustment of the applied voltage, reference numeral 49 denotes an entry field of the voltage applied to the respective electrodes, reference numeral 50 denotes a button for setting the input value of the applied voltage for the control unit, reference numeral 51 denotes a button for executing measurement of the image distortion amount, reference numeral 74 denotes a slider for changing the applied voltages to all the electrodes at a constant rate, and reference numeral 75 denotes an entry field of a change rate of the applied voltage.

Seventh Embodiment

A seventh embodiment describes an expected phase plate adjustment procedure in a system with a function for adjusting the potential distributions at the center of the opening as described in the sixth embodiment. The procedure will be carried out through processing of various programs by the computer 36 based on the instruction input by the user who operates the input/output unit as the GUI.

Distortion of the light and shade ring 53 in the diffractgram of the pattern 40 may be caused by two major factors as follows.
i) The potential distributions generated by the electrode 11 are isotropic to the center of the opening 23, but the non-scattered wave spot 8 is deviated from the center of the opening 23 of the phase plate.
ii) The non-scattered wave spot 8 corresponds to the center of the opening 23 of the phase plate, but the potential distributions generated by the electrode 11 are not isotropic to the center of the opening 23.

<Procedure 1>

Figure 14:
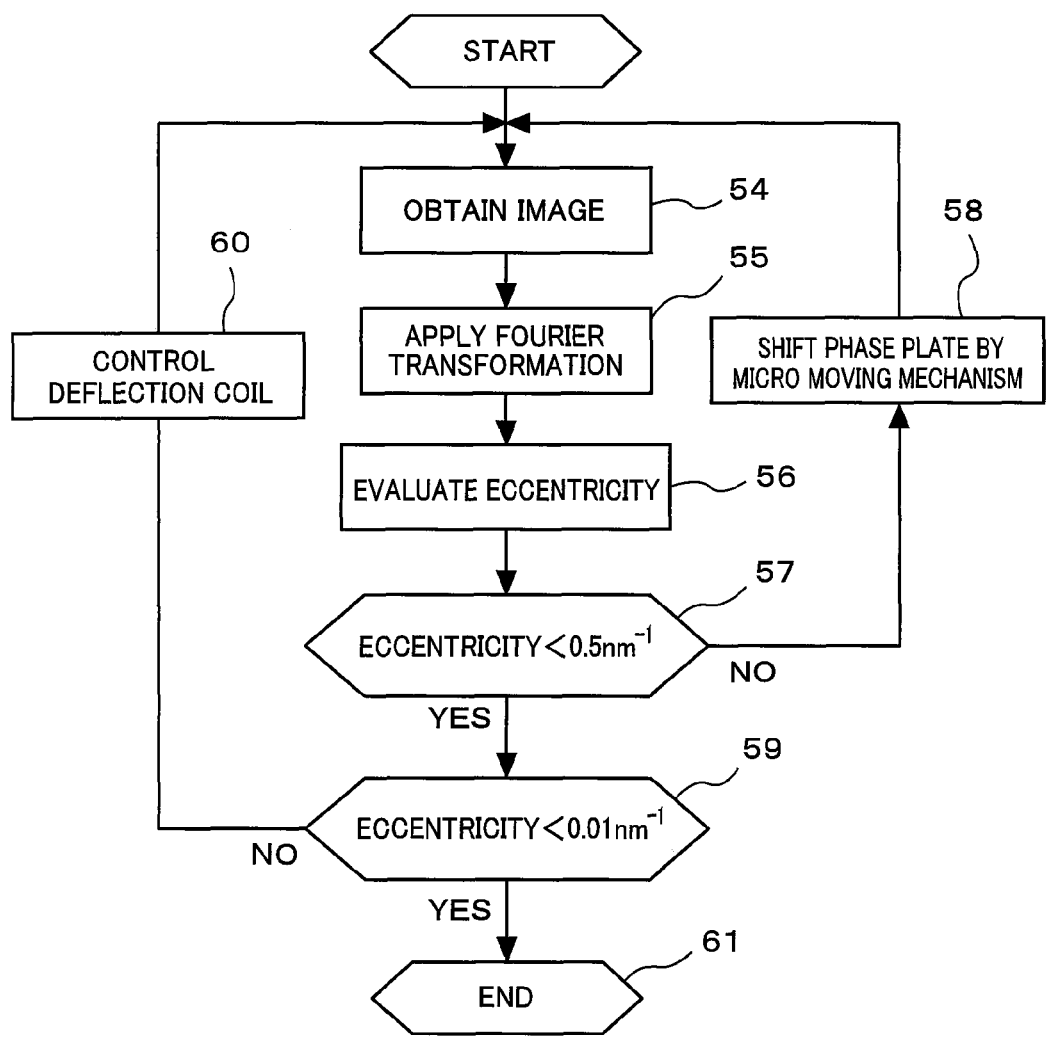
FIG. 14 is a flowchart representing a part of a phase plate adjustment procedure according to a seventh embodiment.

The adjustment procedure to be carried out when the factor falls under i) will be described referring to the flowchart shown in FIG. 14. First, an image is obtained from the TEM (54) and Fourier transformation is applied (55) to obtain the diffractgram as the pattern 40. The position of the shade 52 of the electrode which appears in the diffractgram is located to evaluate the difference in the center between the shade 52 of the electrode and the diffractgram (hereinafter referred to as eccentricity) (56). If the eccentricity has a relatively large value (for example, 0.5 nm$^{-1}$ or larger) (57), a control signal is sent from the control unit 35 to the micro moving mechanism 34 so as to mechanically shift the phase plate 21 towards the direction for decreasing the eccentricity (58). The aforementioned eccentricity measurement and shifting of the phase plate are repeatedly carried out. Then when the eccentricity has the relatively small value (for example, 0.5-nm$^{-1}$ or smaller) (59), the phase plate 21 is not mechanically controlled, but the electron beam is adjusted by controlling a deflection coil 76 of the TEM (60). The electron beam adjustment is further repeated until the eccentricity becomes the threshold value (0.05 nm$^{-1}$ or smaller). The adjustment is then stopped.

<Procedure 2>

When the factor falls under ii), the voltage to be applied to the respective electrodes 11 of the phase plate is adjusted to correct the anisotropic potential distributions generated by the phase plate. The adjustment repeats operations for obtaining the applied voltage value for minimizing the distortion amount of the light and shade ring 53 by varying the voltage applied to the electrode in a predetermined voltage range. If the value input into the entry field 45 of the reference voltage is set to $V_{ref}$, and the value input into the entry field 46 of the adjustment range is set to $V_{adj}$ on the adjustment screen shown in FIG. 13, the voltage range between $V_{ref}-V_{adj}$ and $V_{ref}+V_{adj}$ may be set.

Figure 15:
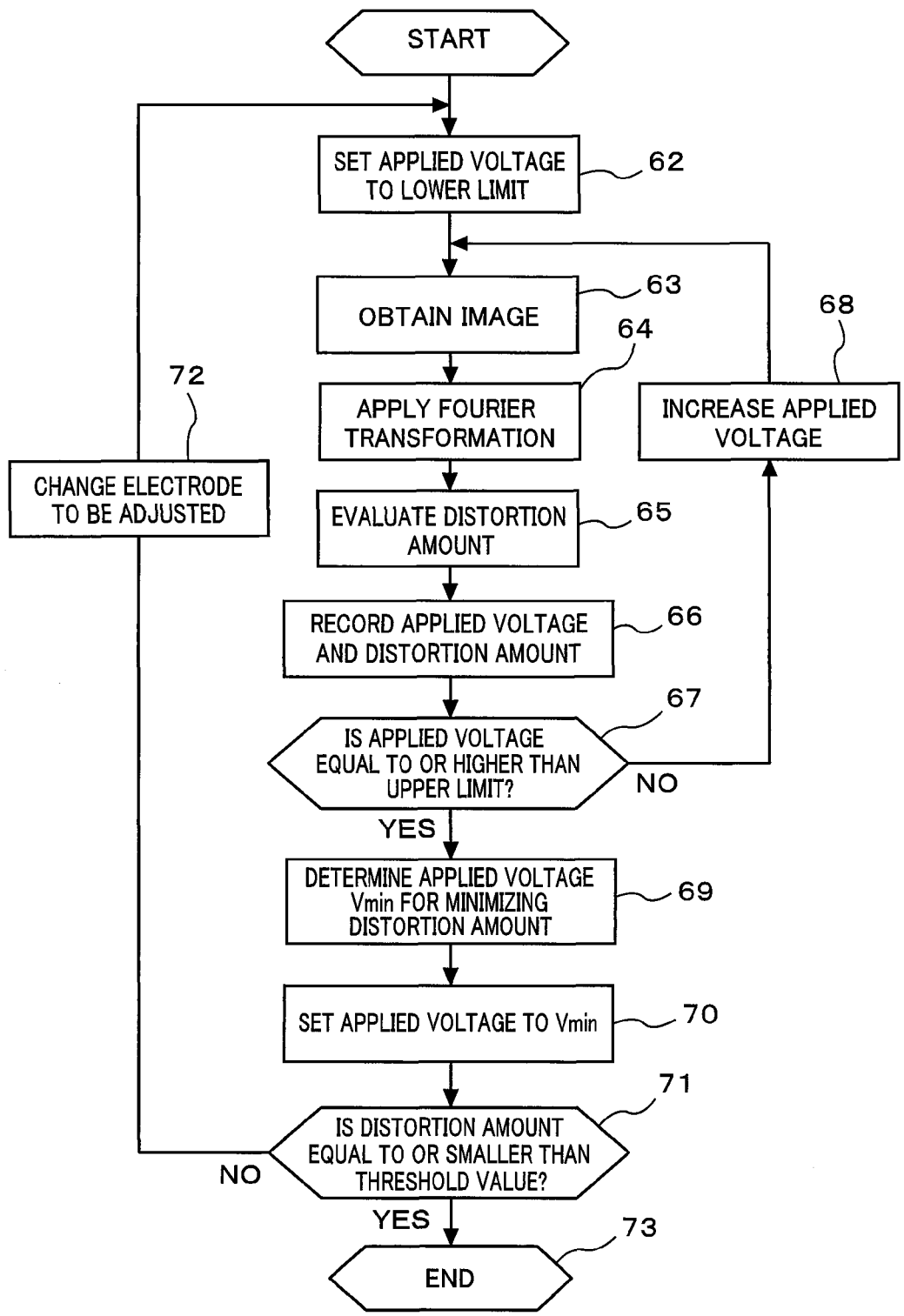
FIG. 15 is a flowchart representing a part of the phase plate adjustment procedure according to the seventh embodiment.
Figure 16:
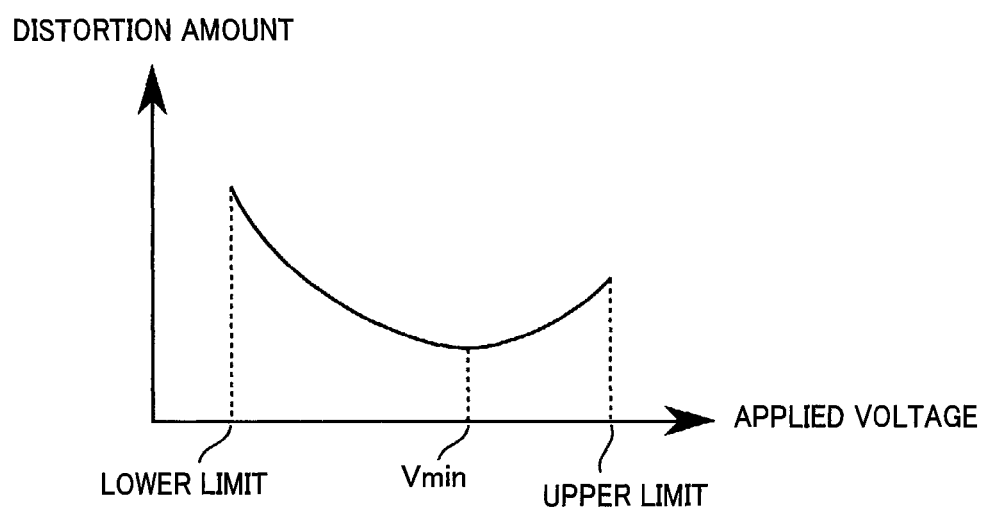
FIG. 16 is a graph representing a relationship between the voltage applied to the phase plate electrode and the image distortion.

The adjustment procedure will be described referring to the flowchart shown in FIG. 15. First, the voltage to be applied to any of the electrodes is set to the lower limit ($V_{ref}-V_{adj}$) (62). Then the image is obtained from the TEM (63) and Fourier transformed (64) for evaluating the distortion amount of the image (65). The evaluation is repeatedly carried out stepwise while increasing the applied voltage to the upper limit ($V_{ref}+V_{adj}$) (66, 67, 68) so as to obtain the relationship between the applied voltage and the distortion amount as shown in FIG. 16. The value for minimizing the distortion amount in the aforementioned relationship is set to the value of $V_{min}$ (69), which is set as the applied voltage to the electrode (70). If the distortion amount exceeds the threshold value, the similar adjustment is further carried out for the other electrode (72). The adjustment is repeatedly carried out for the respective electrodes, and is finished when the distortion amount is below the threshold value (73). For example, the ellipticity of the light and shade ring is used as the distortion amount, and the threshold value is set to the ellipticity of 1.2. As another example, the distortion amount is obtained as the radius ratio between inner and outer circles when interposing any one of the light and shade rings 53 between two geometrical concentric circles, and the threshold value may be determined as the ratio of the radius between the outer circle and the inner circle, which is set to 5:4.

Execution of the aforementioned procedures 1 and 2 successively enables adjustment of the phase modulation automatically applied by the phase plate to be isotropic with respect to the non-scattered wave. Pursuing the adjustment as described above, the operator is allowed to perform a series of process steps by selecting the automatic adjustment button 47 shown in FIG. 13.

Eighth Embodiment

Another example of the procedure 2 as described in the seventh embodiment may be considered. An eighth embodiment will describe the example as the procedure 3.

<Procedure 3>

The anisotropic potential distributions generated by the phase plate vary depending on balance of the voltage applied to the respective electrodes. The potential of one of the constituent electrodes is fixed, and the applied voltages to the rest of the electrodes are made variable, which makes it possible to verify the balance among various voltages. As for an example of the verification, if the reference applied voltage is set to $V_{ref}$, and the voltage change amount is set to $V_{adj}$, the voltage may be applied to the respective electrodes in three stages, that is, $V_{ref}-V_{adj}$, $V_{ref}$, and $V_{ref}+V_{adj}$. FIG. 18 is a table presenting combination conditions of the applied voltages to the respective electrodes as defined above. The table shows nine combination conditions in total, which are obtained by fixing the applied voltage $V_1$ to one of three electrodes of the phase plate to $V_{ref}$, and changing the applied voltages $V_2$ and $V_3$ to the two electrodes in three stages of $V_{ref}-V_{adj}$, $V_{ref}$ and $V_{ref}+V_{adj}$.

Figure 17:
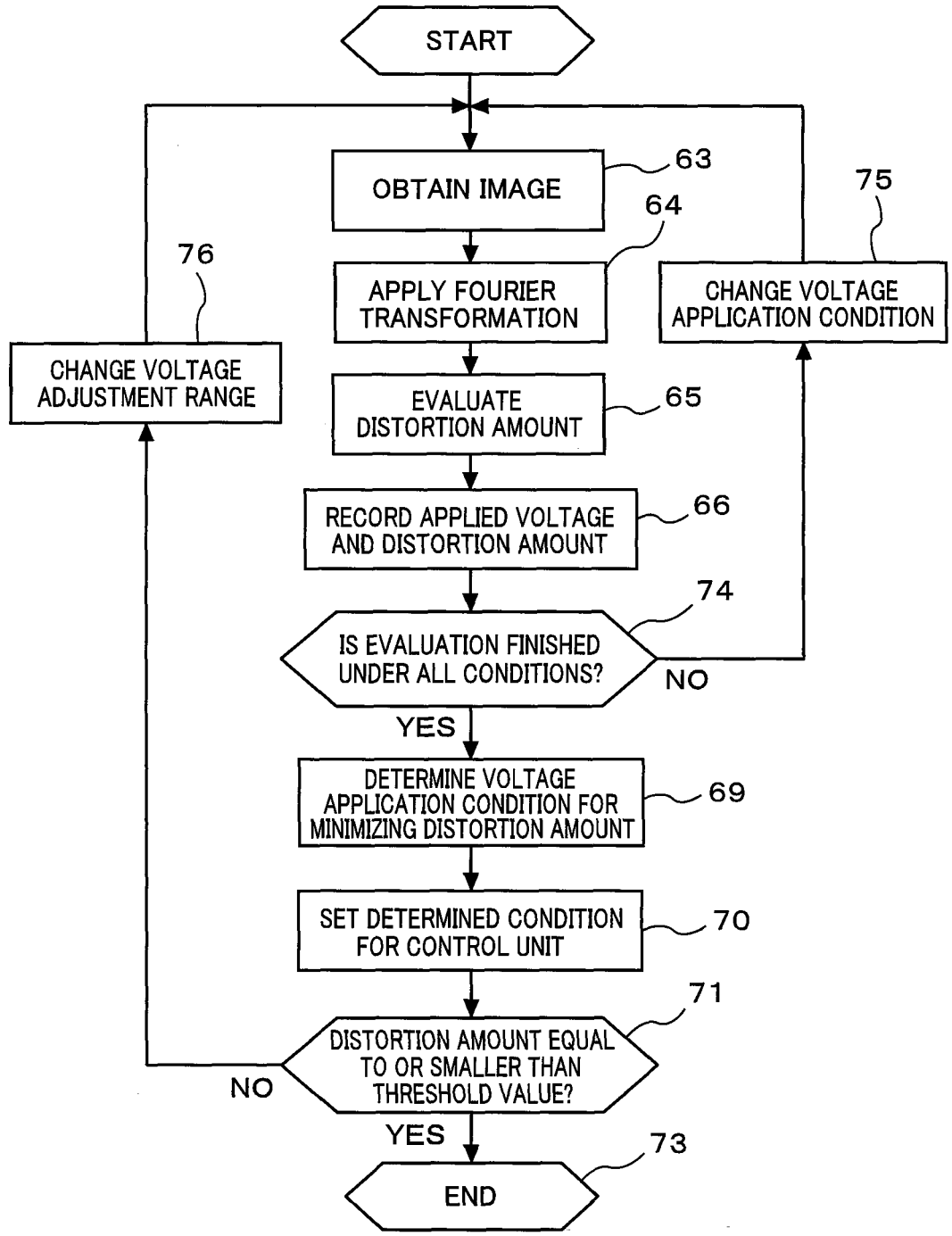
FIG. 17 is a flowchart representing a part of the phase plate adjustment procedure according to an eighth embodiment.

FIG. 17 represents the adjustment procedure. Likewise the procedure 2, a series of process steps are carried out for obtaining the image from the TEM (63), applying Fourier transformation (64), evaluating the distortion amount (65), and recording the relationship between the applied voltage and the distortion amount (66) under the respective conditions shown in FIG. 18 (74, 75). Among the evaluated conditions, the one for minimizing the distortion amount is determined (69), and the condition is set for the phase plate (70). If the distortion amount under the condition is larger than the threshold value, the voltage change amount $V_{adj}$ is changed (76), and the adjustment is repeated again. The adjustment is finished when the distortion amount becomes smaller than the threshold value. As the combination conditions of the respective applied voltages used for the adjustment, in addition to the combinations shown in FIG. 18, it is possible to provide the combination by keeping the potential $V_2$ or $V_3$ constant, or changing the applied voltages to the respective electrodes in more stages. The result under the condition that has not been actually measured may be estimated by using the interpolation calculation. Magnitude of the applied voltage to the respective electrodes may be determined under the combination condition by varying the respective values of $V_1$, $V_2$ and $V_3$ as references upon start of the adjustment procedure rather than varying the value of $V_{ref}$ as the reference.

Various embodiments according to the present invention have been described. It is to be understood that the present invention is not limited to the aforementioned embodiments, and includes various modified examples. For example, the aforementioned embodiments have been explained in detail for better understanding of the present invention. Therefore, it is not necessarily limited to the one with all structures as described above.

A part of the structure of the embodiment may be replaced with the structure of the other embodiment. Furthermore, a structure of the embodiment may be added to that of the other embodiment. Alternatively, the other structure may be added to, removed from, and replaced with a part of the structure of the respective embodiments.

The respective structures, functions and processing units of the aforementioned system may be partially or entirely realized by hardware through designing with an integrated circuit. It is also possible to enable the software through development of the program to partially or entirely realize those of the system.

REFERENCE SIGNS LIST 1 observation sample
2 electron beam
3 scattered wave
4 non-scattered wave
5 objective lens
6 back focal plane
7 scattered wave spot
8 non-scattered wave spot
9 image surface
10 optical axis
11 electrode
12 shield layer
13 insulating layer
14 voltage application layer
15 insulating layer
16 objective diaphragm plate
17 opening-forming hole
18 fixing hole
19 shield layer
20 phase plate opening and electrode forming position
21 phase plate
22 peripheral area of opening
23 phase plate opening
24 voltage application layer
25 insulating layer
26 shield layer
27 adhesion substance
28 power source
29 reference resistor
30 electron source
31 irradiation system lens
32 magnifying lens
33 fluorescent screen
34 micro moving mechanism
35 control unit
36 computer
37 input device
38 display device
39 control screen
40 diffractgram
41 actual space image
42 area for displaying image distortion amount
43 area for displaying applied voltage
44 button for selecting operation of voltage application
45 entry field of reference value of applied voltage
46 entry field of adjustment range of applied voltage
47 button for automatic adjustment of applied voltage
48 button for detail setting of automatic adjustment
49 entry field of applied voltage
50 button for setting applied voltage
51 button for measuring image distortion amount
52 shade of phase plate electrode
53 light and shade ring
54 obtain image from TEM
55 apply Fourier transformation to image
56 evaluate eccentricity
57 determination of condition based on eccentricity
58 mechanical control of phase plate position
59 determination of condition based on eccentricity
60 electron beam orbit adjustment using deflection coil
61 end of process
62 set applied voltage to electrode
63 obtain image from TEM
64 apply Fourier transformation to image
65 evaluate image distortion amount
66 record applied voltage and distortion amount
67 determination based on applied voltage value
68 increase applied voltage
69 determination of applied voltage for minimizing distortion amount
70 set applied voltage to electrode
71 determination based on image distortion amount
72 change electrode to be adjusted
73 end of process
74 slider for controlling change rate of applied voltage
75 entry field of change rate of applied voltage
76 deflection coil

The invention claimed is:
1. A phase plate used for an electron microscope, comprising:

openings connected into a single opening; and multiple electrodes arranged in the single opening, each of the multiple electrodes extending from an outer portion of the single opening toward a center of the single opening, wherein the multiple electrodes have voltage application layers covered by shield layers via insulators, wherein the voltage application layers and the shield layers are each composed of a conductor or a semiconductor, wherein sidewalls of the outer portion of the single opening are covered by the shield layers, and wherein the multiple electrodes have the voltage application layers exposed at respective inner sidewalls facing the center of the single opening.

2. The phase plate according to claim 1, wherein the multiple electrodes are provided in a rotational symmetric arrangement with respect to the center of the opening.

3. The phase plate according to claim 1, wherein the voltage application layers of the multiple electrodes are electrically independent.

4. The phase plate according to claim 3, wherein each of the multiple electrodes has a plurality of the voltage application layers inside, each of which is composed of the conductor or the semiconductor.

5. The phase plate according to claim 1, wherein other sidewalls of the multiple electrodes are covered by the shield layers, the other sidewalls extending from the outer portion of the single opening to the inner sidewalls.

6. The phase plate according to claim 1, wherein each of the multiple electrodes has a width which is reduced from the outer portion of the opening towards the center of the opening.

7. The phase plate according to claim 1, wherein each of the multiple electrodes has a shape which forms a curve from the outer portion of the opening towards the center of the opening.

8. A phase plate used for an electron microscope, comprising:

an opening; and multiple electrodes arranged in the opening, each of the multiple electrodes extending from an outer portion of the opening toward a center of the opening, wherein:

the multiple electrodes have voltage application layers covered by shield layers via insulators;

the voltage application layers and the shield layers are each composed of a conductor or a semiconductor;

a number of the multiple electrodes in the opening is an odd number; and the voltage application layers of the multiple electrodes are electrically independent from one another.

9. The phase plate according to claim 8, wherein first sidewalls of the multiple electrodes are covered by the shield layers, the first sidewalls extending from the outer portion of the opening to inner sidewalls that face the center of the opening.

10. The phase plate according to claim 8, wherein:

sidewalls of the outer portion of the opening are covered by the shield layer; and the multiple electrodes have the voltage application layers exposed at respective inner sidewalls that face the center of the opening.

11. An electron microscope for observing a sample using an electron beam, comprising:

a source of the electron beam;

an irradiation optical system for irradiating the sample with the electron beam emitted from the source;

a lens system for forming an image of the sample;

a phase plate which applies a phase difference to the electron beam from the sample;

a control unit for controlling the electron microscope; and a display device connected to the control unit for displaying an observation image of the sample, wherein:

the phase plate includes openings connected into a single opening, and multiple electrodes arranged in the single opening, each of the multiple electrodes extending from an outer portion of the single opening toward a center of the single opening;

the multiple electrodes have voltage application layers covered by shield layers via insulators;

the voltage application layers and the shield layers are each composed of a conductor or a semiconductor, sidewalls of the outer portion of the single opening are covered by the shield layers, and wherein the multiple electrodes have the voltage application layers exposed at respective inner sidewalls facing the center of the single opening.

12. The electron microscope according to claim 11, further comprising a micro moving mechanism controlled by the control unit to enable micro movement of a position of the phase plate.

13. The electron microscope according to claim 11, wherein:

the voltage application layers of the multiple electrodes of the phase plate are electrically independent; and the control unit is capable of independently controlling a magnitude of a voltage applied to the multiple electrodes.

14. The electron microscope according to claim 13, wherein the display device displays a control screen for controlling the magnitude of the voltage to be applied to the multiple electrodes.

15. The electron microscope according to claim 14, wherein the display device displays a diffractgram as the observation image of the sample, and is capable of adjusting the magnitude of the voltage applied to the multiple electrodes on the control screen based on the diffractgram.

16. The electron microscope according to claim 11, wherein other sidewalls of the multiple electrodes of the phase plate are covered by the shield layers, the other sidewalls extending from the outer portion of the single opening to the inner sidewalls.

17. An electron microscope for observing a sample using an electron beam, comprising:

a source of the electron beam;

an irradiation optical system for irradiating the sample with the electron beam emitted from the source;

a lens system for forming an image of the sample;

a phase plate which applies a phase difference to the electron beam from the sample;

a control unit for controlling the electron microscope; and a display device connected to the control unit for displaying an observation image of the sample, wherein the phase plate includes an opening and multiple electrodes arranged in the opening, each of the multiple electrodes extending from an outer portion of the opening toward a center of the opening, the multiple electrodes have voltage application layers covered by shield layers via insulators, the voltage application layers and the shield layers are each composed of a conductor or a semiconductor, and a number of the multiple electrodes in the opening is an odd number.

18. The electron microscope according to claim 17, wherein first sidewalls of the multiple electrodes are covered by the shield layers, the first sidewalls extending from the outer portion of the opening to inner sidewalls that face the center of the opening.

19. The electron microscope according to claim 17, wherein:
- sidewalls of the outer portion of the opening are covered by the shield layers; and
- the multiple electrodes have the voltage application layers exposed at respective inner sidewalls that face the center of the opening.

* * * * *